United States Patent
Soejima et al.

(10) Patent No.: US 9,815,092 B2
(45) Date of Patent: Nov. 14, 2017

(54) ULTRASONIC CLEANING APPARATUS

(71) Applicant: KAIJO CORPORATION, Hamura-shi, Tokyo (JP)

(72) Inventors: Junichiro Soejima, Hamura (JP); Akihisa Nakano, Hamura (JP); Yasuhiro Imazeki, Hamura (JP); Hiroshi Hasegawa, Hamura (JP)

(73) Assignee: KAIJO CORPORATION, Tokyo (JP)

( * ) Notice: Subject to any disclaimer, the term of this patent is extended or adjusted under 35 U.S.C. 154(b) by 133 days.

(21) Appl. No.: 14/439,541

(22) PCT Filed: Apr. 17, 2014

(86) PCT No.: PCT/JP2014/060947
§ 371 (c)(1),
(2) Date: Apr. 29, 2015

(87) PCT Pub. No.: WO2015/001834
PCT Pub. Date: Jan. 8, 2015

(65) Prior Publication Data
US 2015/0283588 A1  Oct. 8, 2015

(30) Foreign Application Priority Data
Jul. 4, 2013 (JP) .................................. 2013-140824

(51) Int. Cl.
*B08B 3/00* (2006.01)
*B08B 3/02* (2006.01)
(Continued)

(52) U.S. Cl.
CPC .................. *B08B 3/02* (2013.01); *B08B 3/12* (2013.01); *H01L 21/02052* (2013.01);
(Continued)

(58) Field of Classification Search
CPC ......... H01L 21/02052; H01L 21/02087; H01L 21/67051; B08B 3/12; B08B 3/02; B08B 2203/0288
(Continued)

(56) References Cited

U.S. PATENT DOCUMENTS

| 6,516,815 B1 | 2/2003 | Stevens et al. |
| 2002/0113039 A1 | 8/2002 | Mok et al. |

(Continued)

FOREIGN PATENT DOCUMENTS

| JP | 2001-135612 A | 5/2001 |
| JP | 2004-363453 A | 12/2004 |

(Continued)

OTHER PUBLICATIONS

Taiwanese Office Action dated Jun. 29, 2015, by the Taiwan Patent Office in corresponding Taiwan Patent Application No. 10420865380 (6 pgs).
International Search Report (PCT/ISA/210) dated Jun. 24, 2014, by the Japanese Patent Office as the International Searching Authority for International Application No. PCT/JP2014/060947.

(Continued)

*Primary Examiner* — Eric Golightly
(74) *Attorney, Agent, or Firm* — Buchanan Ingersoll & Rooney PC

(57) ABSTRACT

An ultrasonic cleaning apparatus and an ultrasonic cleaning method for an edge face of a substrate help prevent re-contamination caused by splashing or the like of ultrasonic wave propagating water sprayed onto an edge face of an object to be cleaned. An ultrasonic wave transmitting tube provided to continue from the spot shower and configured to transmit and spray the ultrasonic wave propagating water to the substrate is provided, the ultrasonic wave transmitting tube is installed so as not to be positioned on the substrate, the substrate is retained so that the surface of the substrate assumes a horizontal state, and ultrasonic wave propagating water is sprayed to the edge face, which constitutes an outer periphery of the substrate arranged in a space from the ultrasonic wave transmitting tube in a direction of tangent line of the edge face while rotating the substrate by a rotatable rotation retaining portion.

7 Claims, 8 Drawing Sheets

(51) Int. Cl.
  *H01L 21/67*  (2006.01)
  *H01L 21/02*  (2006.01)
  *B08B 3/12*   (2006.01)

(52) U.S. Cl.
  CPC .. *H01L 21/02087* (2013.01); *H01L 21/67051* (2013.01); *B08B 2203/0288* (2013.01)

(58) Field of Classification Search
  USPC .................................................. 134/137, 153
  See application file for complete search history.

(56) References Cited

U.S. PATENT DOCUMENTS

| 2007/0017547 | A1 | 1/2007 | Miyahara et al. |
| 2009/0070946 | A1 | 3/2009 | Tamada et al. |

FOREIGN PATENT DOCUMENTS

| JP | 2004363453 A | * | 12/2004 |
| JP | 2007-022866 A | | 2/2007 |
| JP | 2007-289807 A | | 11/2007 |
| JP | 2009-071235 A | | 4/2009 |
| JP | 2011-035063 A | | 2/2011 |
| TW | 455920 B | | 9/2001 |
| TW | 200703495 | | 1/2007 |

OTHER PUBLICATIONS

Office Action dated Aug. 15, 2014, by the Japanese Patent Office in corresponding Japanese Patent Application No. JP 2013-140824.

\* cited by examiner

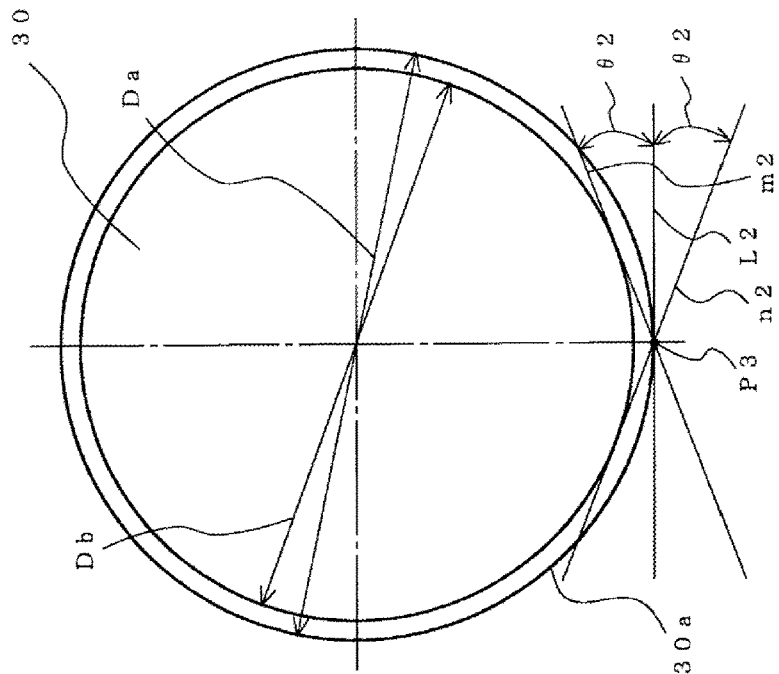
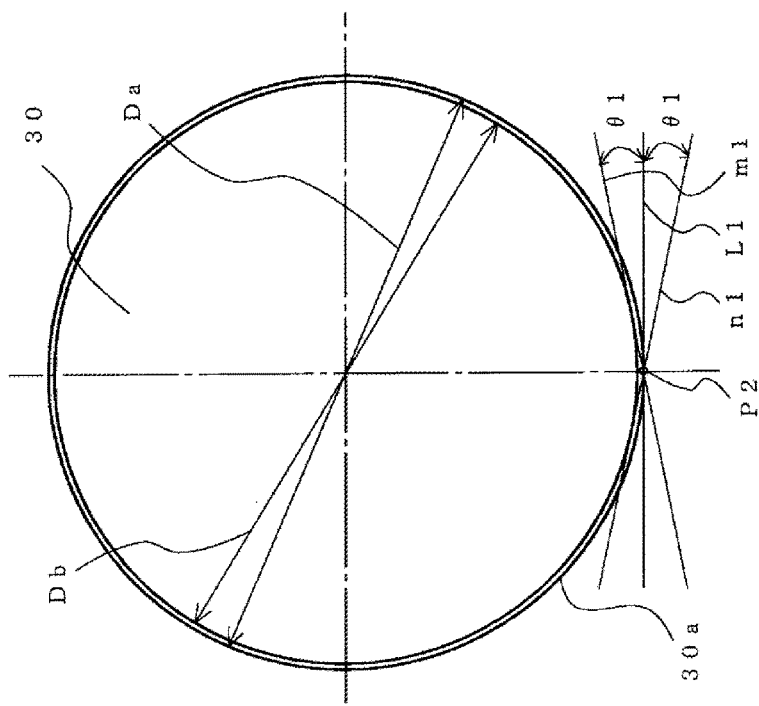

ULTRASONIC CLEANING APPARATUS

FIELD

The present invention relates to an ultrasonic cleaning apparatus and an ultrasonic cleaning method configured to clean edge faces of the substrate as disc-shaped objects to be cleaned such as semiconductor wafer substrates, glass substrates, and magnetic disk substrates with ultrasonic wave propagating water.

BACKGROUND

In the related art, cleaning of substrates such as semiconductor wafers is achieved by immersing an object to be cleaned in a cleaning bath having cleaning liquid stored therein and oscillating an ultrasonic transducer provided on a bottom of the cleaning bath. Since large-sized objects to be cleaned cannot be immersed in the cleaning bath, a handy-type ultrasonic cleaning tool is used for such objects to be cleaned. The handy-type ultrasonic cleaning tool is used for preventing re-adherence of particle, for example, for semiconductor wafer substrates, depending on characteristics and materials of objects to be cleaned.

Disc-shaped substrates such as semiconductor wafer substrates and glass substrates need cleaning after processes such as polishing and etching. Cleaning of a substrate such as a semiconductor wafer is performed to remove particle adhered to an edge face of the substrate due to polishing. This is for chucking the edge faces of the substrates at the time of handling the substrates or for preventing the edge faces of the substrates from being contaminated by particle adhered to the edge faces of the substrates at the time of storage of the substrates into a cassette.

Patent Literature 1 discloses a method of cleaning a glass substrate including rotating a disc-shaped glass substrate with a main surface thereof extending perpendicularly and flowing cleaning liquid W irradiated with an ultrasonic wave on an outer peripheral edge face of the rotating glass substrate. According to FIG. 1 and FIG. 2 in Patent Literature 1, the cleaning liquid W irradiated with the ultrasonic wave is flowed in a perpendicular direction on outer peripheral edge faces of a plurality of glass substrates held perpendicularly at a distance from each other in parallel in a vertical direction. In other words, the cleaning liquid W is flowed from the outside of the outer peripheral edge faces of the glass substrates toward centers of the glass substrates to clean the outer peripheral edge faces of the glass substrates.

CITATION LIST

Patent Literatures

PTL1: Japanese Patent No. 4586660

SUMMARY OF INVENTION

Technical Problem

The disc-shaped substrates such as semiconductor wafer substrates and glass substrates are subjected to cleaning for removing particle adhered to the edge faces of the substrates in order to prevent contamination of surfaces of the substrates due to the particle adhered to the edge faces of the substrates. Cleaning is performed by spraying the cleaning liquid applied with an ultrasonic wave onto objects to be cleaned with a nozzle of a spot shower or the like. The cleaning liquid applied with the ultrasonic wave which is sprayed into a space with a spot shower or the like is referred to as an "ultrasonic wave propagating water".

However, with the cleaning performed by spraying the object to be cleaned with the ultrasonic wave propagating water, a stable distance of movement of the ultrasonic wave is a frequency of 950 kHz and on the order of 30 mm. With distance longer than that, a capillary wave is generated in the cleaning liquid and the cleaning liquid becomes mist. Therefore, the cleaning liquid as a propagating medium of the ultrasonic wave is reduced, and propagation of the sound becomes weak. Therefore, in order to perform stable cleaning, the nozzle or the like of the spot shower needs to be moved closer to the object to be cleaned.

FIG. 8 is a plan view illustrating a positional relationship between the disc-shaped substrate and the spot shower in cleaning of the edge face of the substrate of the related art. As illustrated in FIG. 8, when cleaning an edge face 30a of a disc-shaped object to be cleaned (substrate) 30, a spot shower 5 is arranged at a position on an extension of a center line of the object to be cleaned (substrate) 30 illustrated by an alternate chain line. Ultrasonic wave propagating water 13 from the spot shower 5 is sprayed substantially vertical to a direction of a tangent line of the edge face 30a of the object to be cleaned (substrate) 30. However, a maximum propagation distance dmax of the ultrasonic wave propagating water illustrated in FIG. 8 is on the order of 30 mm, and hence the position to set the spot shower 5 is limited.

The ultrasonic wave propagating water 13 in the cleaning of the related art illustrated in FIG. 8 is sprayed substantially vertical to the direction of the tangent line of the edge face 30a of the object to be cleaned (substrate) 30. Therefore a probability that dirt on the edge face 30a of the object to be cleaned (substrate) 30 is transferred to a surface 30b of the object to be cleaned (substrate), so that the dirt of the surface 30b of the object to be cleaned (substrate) 30 and on the back surface may increase.

In contrast, in the cleaning method disclosed in Patent Literature 1, since the cleaning liquid is sprayed vertically to the outer peripheral edge face of the substrate, the dirt from the outer periphery of the substrate flows on the surface of the substrate together with the cleaning liquid may be adhered to the surface of the substrate.

In addition, when the spot shower as an ultrasonic cleaning tool is arranged at a position in the proximity such as an upper portion of the object to be cleaned such as the substrate, the ultrasonic wave propagating water sprayed to the object to be cleaned may be splashed from the object to be cleaned, and the splashed cleaning liquid is adhered to the spot shower. Water containing the dirt adhered to the spot shower may drop onto the object to be cleaned after the cleaning, so that the object to be cleaned may be re-contaminated.

Accordingly, it is an object of the invention to provide an ultrasonic cleaning apparatus and an ultrasonic cleaning method for an edge face of a substrate, which is capable of preventing re-contamination caused by splashing or the like of ultrasonic wave propagating water sprayed onto an edge face of an object to be cleaned from the object to be cleaned, and cleaning the edge face of the object to be cleaned efficiently.

Solution to Problem

In order to achieve the above-described object, an ultrasonic cleaning apparatus of the present invention is an ultrasonic cleaning apparatus configured to clean an edge face of an outer periphery of a substrate as an object to be cleaned, characterized in that the substrate has a disc shape, the ultrasonic cleaning apparatus includes a rotation retaining portion capable of rotating while retaining the substrate so that a surface of the substrate assumes a horizontal state, and ultrasonic wave propagating water, which is cleaning liquid applied with an ultrasonic wave from a direction of a tangent line of an edge face is sprayed from an ultrasonic cleaning tool toward the edge face which constitutes part of the outer periphery of the substrate arranged in a space while rotating the substrate by the rotation retaining portion.

The ultrasonic cleaning tool of the ultrasonic cleaning apparatus of the present invention is an outflow spot shower configured to spray the ultrasonic wave propagating water like a shower, includes an ultrasonic wave transmitting tube provided so as to Continue from the spot shower and configured to transmit and spray the ultrasonic wave propagating water to the substrate, characterized in that the ultrasonic wave transmitting tube is provided at a position higher than the substrate so that spray angle with respect to the surface of the substrate retained in the horizontal state falls within a range from 0 degree to 90 degrees in side view.

The ultrasonic cleaning apparatus of the present invention is characterized in that the ultrasonic wave transmitting tube is installed so as not to be positioned on the substrate.

The ultrasonic cleaning apparatus of the present invention is characterized in that the ultrasonic wave transmitting tube is formed of a flexible material, so that a position of a leading end thereof, and a spray angle can be set freely.

The ultrasonic cleaning apparatus of the present invention is characterized in that the rotation retaining portion rotates the substrate in the same direction as/or the opposite direction to a direction of spray of the ultrasonic wave propagating water which is sprayed to the edge face of the substrate.

The ultrasonic cleaning apparatus of the present invention is characterized in that the substrate includes a circular pattern area thereon, characterized in that the ultrasonic wave propagating water is sprayed so that a spray angle of the ultrasonic wave propagating water with respect to a tangent line at the contact point of the edge face becomes an angle smaller than an angle calculated from an arc cosine of (Db/Da) with reference to the tangent line at the contact point of the edge face, which constitutes part of the outer periphery of the substrate in plan view, where Da is an outer diameter of the substrate, and Db is an outer diameter of a pattern area of the substrate.

An ultrasonic cleaning method of the present invention is an ultrasonic cleaning method configured to clean an edge face of an outer periphery of a substrate as an object to be cleaned, characterized in that the substrate has a disc shape, the substrate is retained so that the surface of the substrate assumes the horizontal state, and ultrasonic wave propagating water, which is cleaning liquid applied with an ultrasonic wave from a direction of a tangent line of an edge face is sprayed toward the edge face which constitutes part of the outer periphery of the substrate arranged in a space while rotating the retained substrate.

Advantageous Effects of Invention

According to the ultrasonic cleaning apparatus of the present invention, by spraying the ultrasonic wave propagating water from the direction of the tangent line of the edge face of the substrate, the contaminated cleaning liquid may be drained out of the substrate without causing the contaminated cleaning liquid to re-adhere to the surface and the back surface of the substrate. Accordingly, the re-contamination by the cleaning contamination water is prevented and hence cleaning performance is improved.

By spraying the ultrasonic wave propagating water from the direction of the tangent line of the substrate edge face, a separation strength (also referred to as shearing stress) for removing particle and dirt may be improved. In addition, by rotating the substrate in the direction opposite to the direction of spray of the cleaning liquid, the separation strength may further be increased, so that a high cleaning effect is achieved.

By positioning the nozzle configured to spray the cleaning liquid so as not to be positioned on the object to be cleaned, water droplets of the cleaning liquid containing the dirt do not drop from the nozzle onto the surface of the substrate, so that the contamination of the substrate can be prevented.

By using the ultrasonic wave transmitting tube configured to guide the ultrasonic wave propagating water to the spot shower as the ultrasonic cleaning tool, the ultrasonic wave propagating water can be sprayed to a predetermined position on the edge face of the substrate.

In addition, by using the ultrasonic wave transmitting tube configured to be freely deformable, the spot shower can be arranged freely, and hence flexibility in the configuration of the ultrasonic cleaning apparatus is increased.

By using the ultrasonic wave transmitting tube as the spot shower, the spot shower may be arranged at a far distance, so that adhesion of the contaminated cleaning liquid is prevented from adhering a housing of the spot shower.

BRIEF DESCRIPTION OF DRAWINGS

FIG. 5 is a drawing illustrating an outer diameter of a semiconductor wafer substrate, an outer diameter of a pattern area, and a spray angle of cleaning liquid, in which FIG. 5A illustrates a configuration in which the outer diameter of the semiconductor wafer substrate is 300 mm, the outer diameter of the pattern area of 294 mm, and FIG. 5B illustrates a configuration in which the outer diameter of the semiconductor wafer substrate is 300 mm, and an outer diameter of the pattern area is 280 mm.

DESCRIPTION OF EMBODIMENTS

Figure 1:
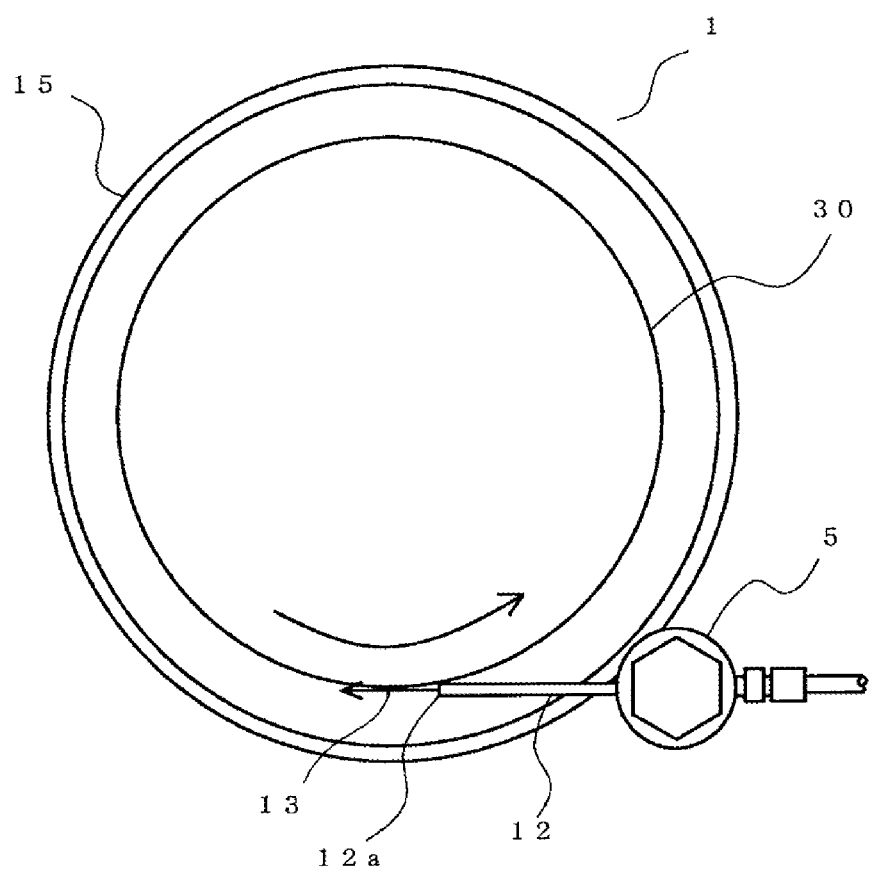
FIG. 1 is a plan view illustrating an outline of an ultrasonic cleaning apparatus configured to clean an edge face of a substrate as an object to be cleaned, and an installation in which a leading end portion of an ultrasonic wave transmitting tube and a surface of the object to be cleaned are arranged to form an angle of approximately 0 degree.

Referring now to the drawings, an embodiment in which an ultrasonic cleaning apparatus and an ultrasonic cleaning method of the present invention are implemented will be described below. The ultrasonic cleaning apparatus and the ultrasonic cleaning method of the present invention is configured to spray ultrasonic wave propagating water onto an edge face which constitute an outer periphery of an object to be cleaned from a direction of a tangent line of the edge face to prevent a re-contamination caused by splashing ultrasonic wave propagating water sprayed onto the edge face of the object to be cleaned from the object to be cleaned, so that the edge face of the object to be cleaned can be cleaned efficiently.

Configuration of Ultrasonic Cleaning Apparatus

Figure 2:
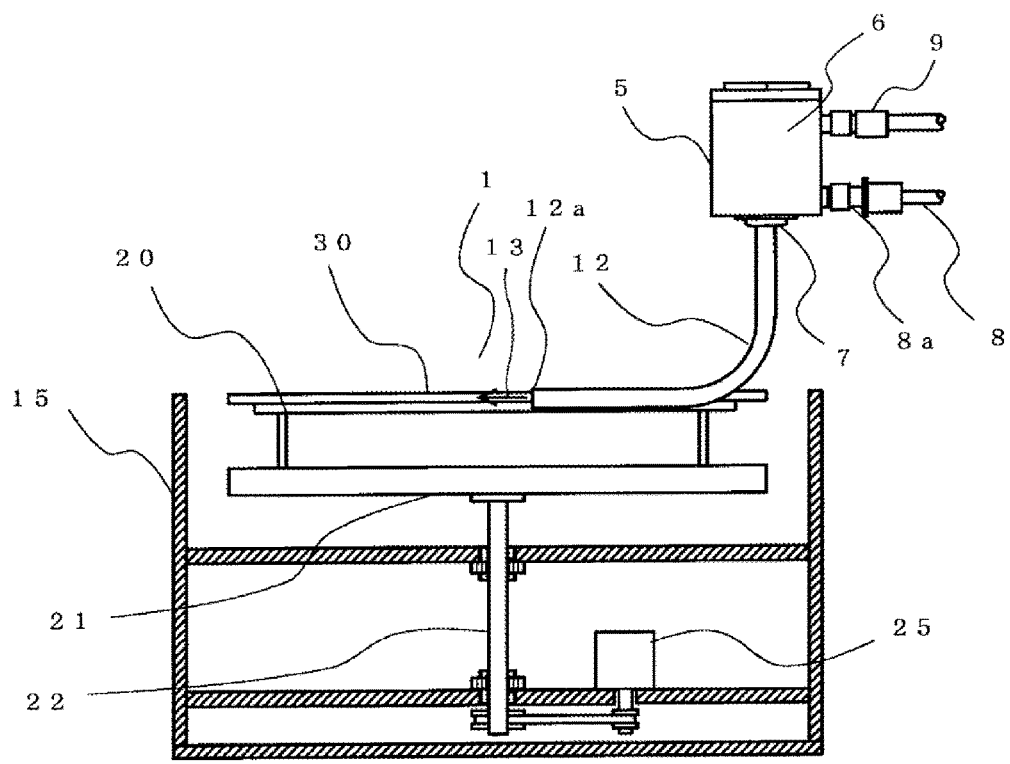
FIG. 2 is a side view including a cross-sectional view of the ultrasonic cleaning apparatus illustrated in FIG. 1.

FIG. 1 is a plan view illustrating an outline of the ultrasonic cleaning apparatus configured to clean an edge face of a substrate as an object to be cleaned, and an installation in which a leading end portion of an ultrasonic wave transmitting tube and a surface of the object to be cleaned are arranged to form an angle of approximately 0 degree. FIG. 2 is a side view including a cross-sectional view of the ultrasonic cleaning apparatus illustrated in FIG. 1. As illustrated in FIG. 1 and FIG. 2, an ultrasonic cleaning apparatus 1 includes a spot shower 5 as an ultrasonic cleaning tool configured to spray ultrasonic wave propagating water 13 onto an object to be cleaned 30, a retaining portion 20 and configured to allow the object to be cleaned 30 provided in a housing 15 to be placed and retained thereon, and a rotating portion 21 configured to rotate the retaining portion 20 that retains the object to be cleaned 30.

As illustrated in FIG. 2, the ultrasonic cleaning tool is a spot shower 5 configured to spray cleaning liquid together with an ultrasonic wave like a shower, and the spot shower 5 includes a substantially cylindrical case (housing) 6, and a nozzle 7 is provided at a leading end portion of the case 6. Since the spot shower 5 is disclosed in Japanese Patent No. 4705509, detailed description will be omitted.

An ultrasonic transducer (not illustrated) is arranged in the case 6 of the spot shower 5, and a cleaning liquid supply port 8a configured to supply the cleaning liquid is formed on a side surface of the case 6. As illustrated in FIG. 2, an ultrasonic wave transmitting tube 12 is arranged so as to continue to the nozzle 7. A leading end portion 12a of the ultrasonic wave transmitting tube 12 is opened, and the ultrasonic wave propagating water 13 is sprayed and sprayed from the leading end portion 12a onto the object to be cleaned 30.

The ultrasonic wave transmitting tube 12 continued to the nozzle 7 is known as being formed of high-purity quartz, high-purity SiC, high-purity Al, or stainless steel, and is preferably formed of these materials. These materials allow processing into a predetermined shape, and hence the ultrasonic wave transmitting tube 12 can be placed at desired positions. In addition, since the ultrasonic wave transmitting tube 12 is formed of a material having flexibility in shaping, and of high-rigidity material such as ceramics, carbon graphite, and high-purity SiC, the ultrasonic wave transmitting tube 12 can be deformed freely at the time of usage, and hence the spot shower 5 can be arranged freely. Consequently, flexibility in configuration of the ultrasonic cleaning apparatus 1 is increased.

The cleaning liquid supplied from the cleaning liquid supply port 8a of the case 6 is rectified into a uniform flow by a rectifying mechanism (not illustrated) formed on the side surface of the nozzle 7, and is sprayed as a uniform water flow column from an exit of the nozzle 7. Accordingly, the ultrasonic wave propagating water 13 is sprayed and sprayed onto the object to be cleaned 30 from the ultrasonic wave transmitting tube 12 continuing to the nozzle 7.

The liquid supply tube 8 is coupled to the cleaning liquid supply port 8a provided on the side surface of the case 6, and supplies cleaning liquid stored in a tank or the like. The cleaning liquid is supplied from the tank or the like to the spot shower 5 at a preset flow rate per unit time via the liquid supply tube 8.

A power supply connector 9 is configured to supply high-frequency power for oscillating an ultrasonic transducer, and a cable of the connector is connected to the ultrasonic generator (not illustrated). The ultrasonic generator supplies a high-frequency power having preset power to the ultrasonic generator at a high frequency such as 450 kHz, 950 kHz, and the like.

The object to be cleaned 30 has a disc shape, and is a substrate which requires cleaning on an edge face of an outer periphery thereof and, for example, includes a semiconductor wafer substrate, a glass substrate, and a magnetic disc substrate.

As illustrated in FIG. 2, the retaining portion 20 is configured to allow the object to be cleaned 30 to be placed and retained thereon and, for example, place the semiconductor wafer substrate or the like with a front surface (a surface where the pattern is formed) faces upward, and retains the back surface of the semiconductor wafer substrate or the like by sucking or the like. At this time, an outer peripheral edge face and an area in the vicinity thereof of the semiconductor wafer substrate are not retained by the retaining portion 20, and positioned in a space.

The rotating portion 21 is configured to rotate the retaining portion 20, and is provided so that the rotating shaft 22 extends vertically with respect to a horizontal surface, and the center of the retaining portion 20 is fixed to a leading end of the rotating shaft 22. The rotating portion 21 is driven by a motor 25, and is configured to rotate at a predetermined number of rotations.

As illustrated in FIG. 2, the ultrasonic cleaning apparatus 1 is retained by the retaining portion 20 so that a surface of the object to be cleaned 30 assumes a horizontal state, and the object to be cleaned 30 retained by the retaining portion 20 is configured to be rotated by the rotating portion 21 while maintaining the horizontal state.

Position of Ultrasonic Wave Transmitting Tube

Figure 3:
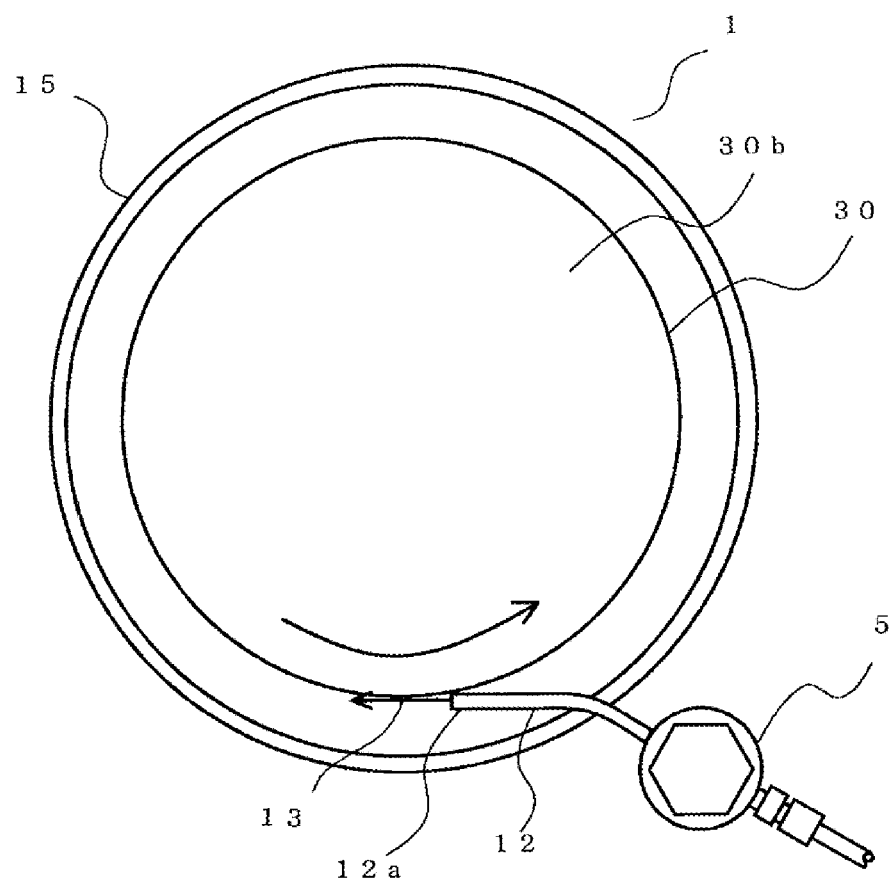
FIG. 3 is a plan view illustrating an outline of the ultrasonic cleaning apparatus configured to clean the edge face of the substrate as the object to be cleaned, and the installation in which the leading end portion of the ultrasonic wave transmitting tube and the surface of the object to be cleaned are arranged to form an angle of approximately 35 degrees.
Figure 4:
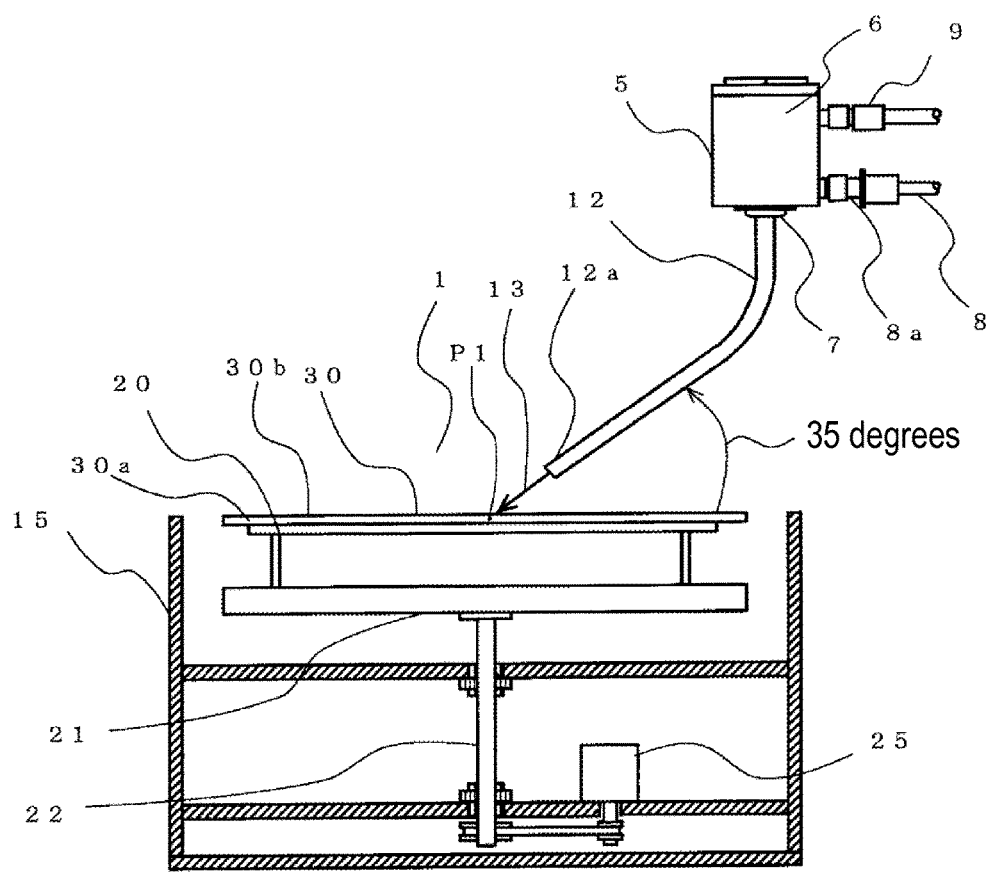
FIG. 4 is a side view including a cross-sectional view of the ultrasonic cleaning apparatus illustrated in FIG. 3.

Subsequently, the position of the ultrasonic wave transmitting tube of the spot shower for cleaning the edge face of the object to be cleaned with respect to the object to be cleaned will be described with reference to FIG. 1 to FIG. 4. FIG. 3 is a plan view illustrating an outline of the ultrasonic cleaning apparatus configured to clean an edge face of a substrate as the object to be cleaned, and an installation in which a leading end portion of the ultrasonic wave transmitting tube and a surface of the object to be cleaned are arranged to form an angle of approximately 35 degrees. FIG. 4 is a side view including a cross-sectional view of the ultrasonic cleaning apparatus illustrated in FIG. 3. The configuration of the ultrasonic cleaning apparatus illustrated in FIG. 3 and FIG. 4 are the same as the configuration of the ultrasonic cleaning apparatus illustrated in FIG. 1 and FIG. 2, and the description will be omitted by using the same reference signs.

As illustrated in FIG. 1 to FIG. 4, the object to be cleaned 30 is retained by the retaining portion 20 so that the front surface assumes the horizontal state. The spot shower 5 and the ultrasonic wave transmitting tube 12 are arranged out of the outer periphery of the object to be cleaned 30, and are arranged so that an angle formed between the leading end portion 12a of the ultrasonic wave transmitting tube 12 and the surface of the object to be cleaned 30 falls within a range from 0 (horizontal state) to 90 degrees. The spot shower 5 may be installed out of the housing 15 as illustrated in FIG. 3.

As illustrated in FIG. 1 and FIG. 2, when the angle of installation is 0 degree, the leading end portion 12a of the ultrasonic wave transmitting tube 12 extends in parallel to the object to be cleaned 30, and the ultrasonic wave propagating water 13 from the leading end portion 12a of the ultrasonic wave transmitting tube 12 is sprayed horizontally. When the angle of installation is 90 degrees, the leading end portion 12a of the ultrasonic wave transmitting tube 12 extends vertical to the object to be cleaned 30, and the ultrasonic wave propagating water 13 from the leading end portion 12a of the ultrasonic wave transmitting tube 12 is sprayed vertically.

In this manner, when the angle of installation is 0 degree, the ultrasonic wave propagating water 13 is sprayed from the leading end portion 12a of the ultrasonic wave transmitting tube 12 so as to be in contact with the outer periphery of the object to be cleaned 30, that is, in the direction of a tangent line of the edge face.

The ultrasonic cleaning apparatus illustrated in FIG. 3 and FIG. 4 is arranged so that the angle of installation between the leading end portion 12a of the ultrasonic wave transmitting tube 12 and a surface 30b of the object to be cleaned 30 is approximately 35 degrees. As illustrated in FIG. 4, the leading end portion 12a of the ultrasonic wave transmitting tube 12 is installed on a line which corresponds to a tangent line at a position P1 on the edge face 30a of the object to be cleaned 30 is rotated about the position P1 by an angle of installation, that is, 35 degrees.

As illustrated in FIG. 1 and FIG. 3, the spot shower 5 and the ultrasonic wave transmitting tube 12 are installed so as not to be positioned within a space extending vertically from an entire surface of the object to be cleaned 30. Accordingly, droplets of the cleaning liquid containing dirt from the spot shower 5 or the ultrasonic wave transmitting tube 12 do not drop on the surface of the object to be cleaned, so that the contamination of the object to be cleaned is prevented.

Spray angle of Ultrasonic Waver Propagating Water

The object to be cleaned (the semiconductor wafer substrate) 30 includes a pattern such as a circuit having a number of IC chips formed on the surface thereof. An area on the object to be cleaned (the semiconductor wafer substrate) 30 on which the pattern is formed has a diameter smaller than an outer diameter of the object to be cleaned (the semiconductor wafer substrate) 30, and is formed concentrically. Accordingly, a ring-shaped surface several millimeters to several tens of millimeters from an outer periphery of the object to be cleaned (the semiconductor wafer substrate) 30 inward toward the center is an area in which the pattern is not formed. The cleaning of the edge face of the object to be cleaned (the semiconductor wafer substrate) 30 needs to avoid the ultrasonic wave propagating water from directly being sprayed onto the pattern area formed on the object to be cleaned (the semiconductor wafer substrate) 30.

Subsequently, a spray angle of the ultrasonic wave propagating water on the object to be cleaned (the semiconductor wafer substrate) 30 or the like having a pattern formed on the surface thereof will be described with reference to FIG. 5. FIG. 5 is a drawing illustrating an outer diameter of the object to be cleaned (the semiconductor wafer substrate) 30, an outer diameter of a pattern area, and a spray angle of the ultrasonic wave propagating water, in which FIG. 5A illustrates a configuration in which an outer diameter of the object to be cleaned (the semiconductor wafer substrate) 30 is 300 mm, an outer diameter of the pattern area of 294 mm, and FIG. 5B illustrates a configuration in which an outer diameter of the object to be cleaned (the semiconductor wafer substrate) 30 is 300 mm, and an outer diameter of the pattern area is 280 mm.

As illustrated in FIG. 5A, for example, when an outer diameter (diameter) Da of a object to be cleaned (the semiconductor wafer substrate) 30 is 300 mm, and an outer diameter Db of the pattern area is 294 mm in plan view, the spray angle of the ultrasonic wave propagating water with respect to a tangent line L1 at a sprayed position P2 of the ultrasonic wave propagating water on the edge face of the object to be cleaned (the semiconductor wafer substrate) 30 is set to an angle smaller than a limit angle illustrated below, the ultrasonic wave propagating water is not sprayed directly on the pattern area.

A spray angle θ1 of the ultrasonic wave propagating water is an inner limit angle, that is, an angle of a straight line m1 formed in a state in which the leading end portion 12a of the ultrasonic wave transmitting tube 12 is positioned on the object to be cleaned (the semiconductor wafer substrate) 30 side, passing through a virtual surface extending in a direction vertical to the outer periphery of the pattern area, and passing the sprayed position P2 on the edge face 30a of the object to be cleaned (the semiconductor wafer substrate) 30 with respect to the tangent line L1 is 11.48 degrees.

In contrast, and an outer limit angle, that is, an angle of straight line n1 formed in a state in which the leading end portion 12a of the ultrasonic wave transmitting tube 12 is positioned apart from the object to be cleaned (the semiconductor wafer substrate) 30, passing through the sprayed position P2 on the edge face 30a of the object to be cleaned (the semiconductor wafer substrate) 30 and passing through the virtual surface extending in the direction vertical to the outer periphery of the pattern area, with respect to the tangent line L1 is 11.48 degrees. In this manner, with a configuration in which the spray angle θ1 of the ultrasonic wave propagating water becomes smaller than 11.48 degrees with reference to a tangent line at a contact point of the edge face which constitutes the outer periphery of the object to be cleaned (the semiconductor wafer substrate) 30, the ultrasonic wave propagating water cannot be sprayed directly in the pattern area.

As illustrated in FIG. 5B, when an outer diameter (diameter) of the object to be cleaned (the semiconductor wafer substrate) 30 is 300 mm, and an outer diameter (diameter) of the pattern area is 280 mm in plan view, the spray angle of the ultrasonic wave propagating water with respect to the tangent line L2 at a sprayed position P3 of the ultrasonic wave propagating water on the outer diameter of the object to be cleaned (the semiconductor wafer substrate) 30 is set to an angle smaller than a limit angle illustrated below in plan view, the ultrasonic wave propagating water is not sprayed directly on the pattern area.

A spray angle θ2 of the ultrasonic wave propagating water is an inner limit angle, that is, an angle of the straight line m2 formed in a state in which the leading end portion 12a of the ultrasonic wave transmitting tube 12 is positioned on the object to be cleaned (the semiconductor wafer substrate) 30 side, passing through the virtual surface extending in the direction vertical to the outer periphery of the pattern area, and passing the sprayed position P3 on the edge face 30a of the object to be cleaned (the semiconductor wafer substrate) 30 with respect to the tangent line L2 is 21.04 degrees.

In contrast, and an outer limit angle, that is, an angle of straight line n2 formed in a state in which the leading end portion 12a of the ultrasonic wave transmitting tube 12 is positioned apart from the object to be cleaned (the semiconductor wafer substrate) 30, passing through the sprayed position P3 of the edge face 30a on the object to be cleaned (the semiconductor wafer substrate) 30 and passing through a virtual surface extending in the direction vertical to the outer periphery of the pattern area, with respect to the tangent line L2 is 21.04 degrees. In this manner, with a configuration in which the spray angle θ2 of the ultrasonic wave propagating water becomes smaller than 21.04 degrees with reference to the tangent line at a contact point of the edge face which constitutes the outer periphery of the object to be cleaned (the semiconductor wafer substrate) 30, the ultrasonic wave propagating water cannot be sprayed directly in the pattern area.

As described above, the substrate as the object to be cleaned has a circular pattern area on the substrate, characterized in that the ultrasonic wave propagating water is sprayed so that a spray angle of the ultrasonic wave propagating water with respect to a tangent line having an intersection at a contact point of the edge face becomes an angle smaller than an angle calculated from an arc cosine of (Db/Da) with reference to the tangent line at the contact point of the edge face, which constitutes part of an outer periphery of the substrate in plan view, where Da is an outer diameter of the substrate, and Db is an outer diameter of the pattern area of the substrate in plan view, so that the ultrasonic wave propagating water is prevented from being sprayed directly to the pattern area formed on the substrate.

Flow Rate of Spot Shower

Subsequently, the flow rate of the spot shower and the rotation of the object to be cleaned during the cleaning will be described. In the cleaning the substrate or the like by the ultrasonic cleaning apparatus, the flow rate of the spot shower 5 is varied depending on a drive frequency of the ultrasonic transducer. For example, when the drive frequency of the ultrasonic transducer is 430 kHz, the flow rate from the leading end of a nozzle of the spot shower 5 is 2 liter/minute to 3.5 liter/minute and, when the drive frequency of the ultrasonic transducer is 950 kHz, the flow rate from the leading end of the nozzle of the spot shower 5 is 1 little/minute to 1.5 little/minute.

The rotation of the object to be cleaned in the cleaning is achieved by the rotating portion 21 so as to rotate in a direction of rotation opposite to the direction of spray of the ultrasonic wave propagating water at the edge face of the object to be cleaned 30 as indicated by arrows on the object to be cleaned 30 illustrated in FIG. 1 and FIG. 3. Accordingly, a relative speed between a flow speed of the ultrasonic wave propagating water and a rotational speed of the object to be cleaned 30 are increased, and hence the separation strength is increased. Therefore, the edge face of the object to be cleaned 30 can be cleaned efficiently. The rotation of the object to be cleaned may be the same direction as the direction of spray of the ultrasonic wave propagating water sprayed on the edge face.

Result of Cleaning of Substrate Edge Face

Figure 6A:
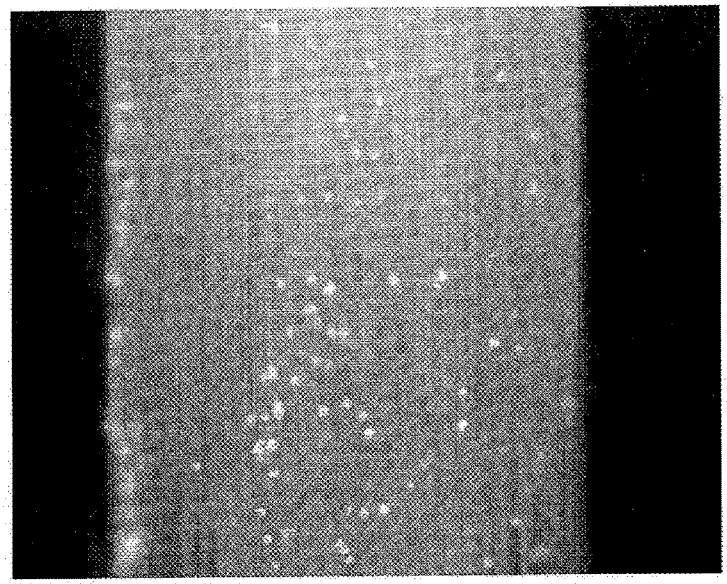
FIG. 6A is a drawing illustrating a state of an edge face of a glass substrate before cleaning on which silica particles are adhered.
Figure 6B:
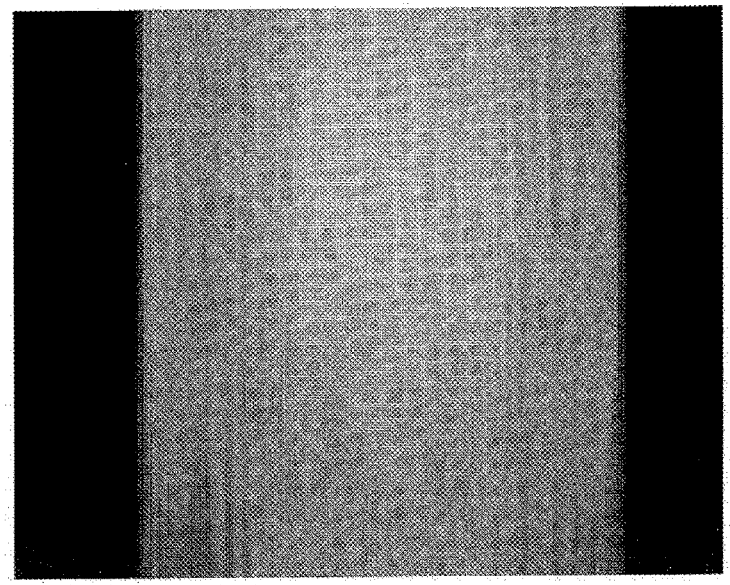
FIG. 6B is a drawing illustrating a state of the edge face of the glass substrate after the cleaning.

Subsequently, a result of cleaning of the edge face of the glass substrate as an object to be cleaned by the ultrasonic cleaning apparatus illustrated in FIG. 1. FIG. 6A is a drawing illustrating a state of an edge face of a glass substrate before cleaning on which silica particles are adhered, and FIG. 6B is a drawing illustrating a state of an edge face of the glass substrate after the cleaning. White dots shown in FIG. 6A is the silica particles. As shown in FIG. 6A, the silica particles are adhered to the edge face of the glass substrate before cleaning. A result of cleaning of the edge face of the glass substrate with the ultrasonic cleaning apparatus illustrated in FIG. 1 is shown in FIG. 6B.

As shown in FIG. 6B, the silica particles adhered to the edge face of the glass substrate were removed after the cleaning. The rate of removal of the silica particles of 0.5 μm or larger was 96.5% in FIG. 6B. Accordingly, the effectiveness of the ultrasonic cleaning apparatus of the present invention is confirmed.

Figure 7A:
FIG. 7A is a state of a glass surface as the object to be cleaned before cleaning.
Figure 7B:
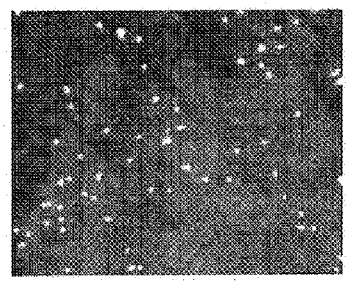
FIG. 7B is a state of the surface of the glass after ultrasonic wave propagating water is sprayed vertically to the edge face of the substrate toward a center of the substrate illustrated in FIG. 8 to clean.
Figure 7C:
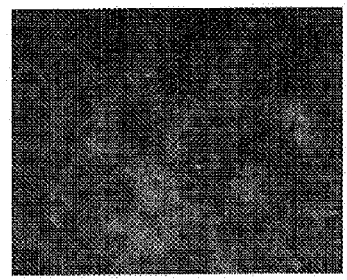
FIG. 7C is a state of the surface of the glass after the ultrasonic wave propagating water has sprayed from a direction of a tangent line of the edge face of the substrate illustrated in FIG. 1 to clean.
Figure 8:
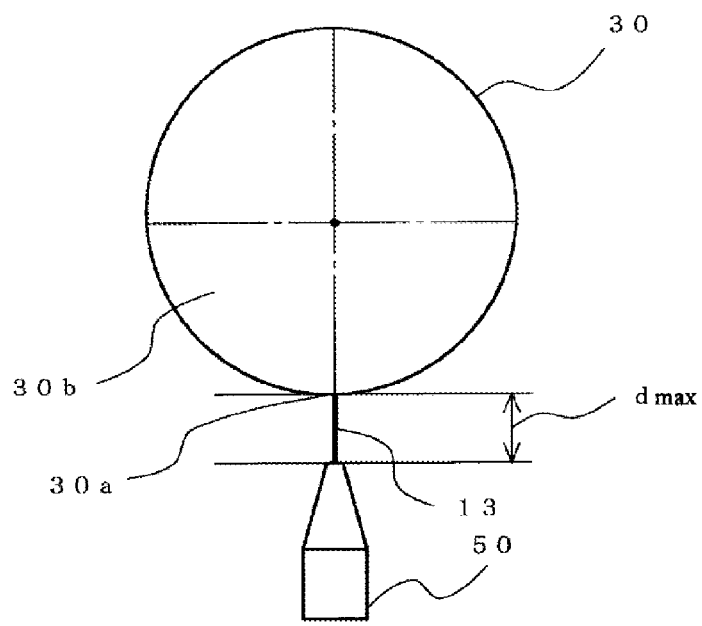
FIG. 8 is a plan view illustrating a positional relationship between a disc-shaped substrate and the spot shower in the cleaning of the edge face of the substrate of the related art.

In addition, in order to verify whether alumina slurry on the edge face of the substrate is re-adhered to the surface of the glass substrate by cleaning of alumina slurry on the edge face of the substrate, comparison between cleaning in which the ultrasonic wave propagating water is sprayed toward the center of the substrate illustrated in FIG. 8 in a direction vertical to the edge face of the substrate, and cleaning in which the ultrasonic wave propagating water is sprayed from the direction of the tangent line of the edge face of the substrate illustrated in FIG. 1 was conducted. FIG. 7A is a state of a surface of the glass substrate the object to be cleaned before cleaning, FIG. 7B is a state of the surface of the glass substrate after ultrasonic wave propagating water is sprayed vertically to the edge face of the substrate toward a center of the substrate illustrated in FIG. 8, FIG. 7C is a drawing illustrating a state of the surface of the glass substrate after the ultrasonic wave propagating water has sprayed from the direction of the tangent line of the edge face of the substrate illustrated in FIG. 1 to clean. FIG. 7A shows a state in which the alumina slurry is not present on the surface of the glass substrate before cleaning.

As a result of the cleaning of the related art in which the ultrasonic wave propagating water is sprayed vertically to the edge face of the glass substrate toward the center of the glass substrate, the fact that the alumina slurry (substance like white dots) on the edge face of the glass substrate was re-adhered to the surface of the glass substrate was confirmed as illustrated in FIG. 7B. In contrast, as shown in FIG. 7C, with the cleaning in which the ultrasonic wave propagating water is sprayed from the direction of the tangent line of the edge face of the glass substrate, re-adherence of the alumina slurry on the edge face of the glass substrate to the surface of the glass substrate was not found.

In this manner, in the case where the cleaning method of the related art as illustrated in FIG. 8, the alumina slurry on the edge face of the glass substrate is removed, but re-adhesion of the alumina slurry on the edge face of the glass substrate to the surface of the glass substrate was observed.

As described above, according to the present invention, by spraying the ultrasonic wave propagating water from the direction of the tangent line of the edge face of the substrate, the contaminated cleaning liquid may be drained out of the substrate without causing the contaminated cleaning liquid to re-adhere to the surface and the back surface of the substrate. Accordingly, the re-contamination by the cleaning contamination water is prevented and hence cleaning performance is improved.

By spraying the ultrasonic wave propagating water from the direction of tangent line of the substrate edge face, a separation strength (also referred to as shearing stress) for removing particle and dirt may be improved. In addition, by rotating the substrate in the direction opposite to the direction of spray of the ultrasonic wave propagating water, the separation strength may further be increased.

By positioning the nozzle configured to spray the ultrasonic wave propagating water so as not to be positioned on the object to be cleaned, water droplets of the ultrasonic wave propagating water containing the dirt do not drop from the nozzle onto the surface of the substrate, so that the contamination of the substrate can be prevented.

By using the ultrasonic wave transmitting tube configured to guide the ultrasonic wave propagating water to the spot shower as the ultrasonic cleaning tool, the ultrasonic wave propagating water can be sprayed to a predetermined position on the edge face of the substrate.

In addition, by using the ultrasonic wave transmitting tube configured to be freely deformable, the spot shower can be arranged freely, and hence flexibility in the configuration of the ultrasonic cleaning apparatus is increased.

By using the ultrasonic wave transmitting tube as the spot shower, the spot shower may be arranged at a far distance, so that adhesion of the contaminated ultrasonic wave propagating water is prevented from adhering a housing of the spot shower.

The invention may be embodying in a number of forms without departing the essential properties. Therefore, the embodiment described above is given exclusively for description, but may not limit the invention.

REFERENCE SIGNS LIST

1: ultrasonic cleaning apparatus
5: ultrasonic cleaning tool (spot shower)
6: case
7: nozzle
8: liquid supply tube
8a: cleaning liquid supply port
9: power supply connector
12: ultrasonic wave transmitting tube
12a: leading end portion
13: ultrasonic wave propagating water
15: housing
20: retaining portion
21: rotating portion
22: rotating shaft
25: motor
30: object to be cleaned (substrate, semiconductor wafer substrate)
30a: edge face of object to be cleaned (substrate)
30b: surface of object to be cleaned (substrate)

The invention claimed is:

1. An ultrasonic cleaning apparatus configured to clean an edge face constituting part of an outer periphery of a substrate as an object to be cleaned, wherein the substrate possesses a disc shape and includes a pattern area on a surface of the substrate, the ultrasonic cleaning apparatus comprising:
a rotation retaining portion configured to rotate while retaining the substrate and while the surface of the substrate assumes a horizontal state,
an ultrasonic cleaning tool including an ultrasonic wave transmitting tube, the ultrasonic wave transmitting tube possessing a distal end arranged such that ultrasonic wave propagating water, which is cleaning liquid applied with an ultrasonic wave, is sprayed from the ultrasonic cleaning tool toward a contact point on the edge face while the substrate is being rotated by the rotation retaining portion;
the ultrasonic wave transmitting tube ejecting the ultrasonic wave propagating water from the distal end of the ultrasonic wave transmitting tube so that a direction of the ejection of the ultrasonic wave propagating water from the distal end of the ultrasonic wave transmitting tube is confined within a range defined by an inner limit angle and an outer limit angle;
a tangent line of the substrate at the contact point defining first and second sides of the tangent line in plan view, the substrate being located on the first side of the tangent line in plan view;
the inner limit angle being defined by a first straight line extending from the distal end of the ultrasonic wave transmitting tube, passing through a first virtual surface extending vertically from an outer periphery of the pattern area, and passing through the contact point, in a state in which the distal end portion of the ultrasonic wave transmitting tube is positioned on the first side of the tangent line in plan view; and
the outer limit angle being defined by a second straight line extending from the distal end of the ultrasonic wave transmitting tube, passing through a second virtual surface extending vertically from an outer periphery of the pattern area, and passing through the contact point, in a state in which the distal end portion of the ultrasonic wave transmitting tube is positioned on the second side of the tangent line in plan view.

2. The ultrasonic cleaning apparatus according to claim 1, wherein the ultrasonic cleaning tool includes an outflow spot shower connected to the ultrasonic wave transmitting tube and configured to spray the ultrasonic wave propagating water like a shower, the ultrasonic wave transmitting tube provided so as to continue from the spot shower and configured to transmit the ultrasonic wave propagating water from the outflow spot shower and spray the ultrasonic wave propagating water to the substrate, wherein the ultrasonic wave transmitting tube is provided at a position higher than the substrate so that a spray angle with respect to the surface of the substrate retained in the horizontal state falls within a range from 0 degree to 90 degrees in side view.

3. The ultrasonic cleaning apparatus according to claim 2, wherein the ultrasonic wave transmitting tube is installed so as not to be positioned on the substrate.

4. The ultrasonic cleaning apparatus according to claim 2, wherein the ultrasonic wave transmitting tube is formed of a flexible material, so that a position of a leading end thereof, and a spray angle can be set freely.

5. The ultrasonic cleaning apparatus according to claim 1, wherein the rotation retaining portion rotates the substrate in the same direction as/or the opposite direction to a direction of spray of the ultrasonic wave propagating water which is sprayed to the edge face of the substrate.

6. The ultrasonic apparatus according to claim 1, wherein the pattern area is a circular pattern area, and the ultrasonic wave propagating water is sprayed so that a spray angle of the ultrasonic wave propagating water with respect to the tangent line at the contact point of the edge face becomes an angle smaller than an angle calculated from an arc cosine of (Db/Da) with reference to the tangent line at the contact point of the edge face, where Da is an outer diameter of the substrate, and Db is an outer diameter of a pattern area of the substrate.

7. An ultrasonic cleaning apparatus configured to clean an edge face constituting part of an outer periphery of a substrate as an object to be cleaned, the substrate possessing a disc shape and including a pattern area on a surface of the substrate, the ultrasonic cleaning apparatus comprising:

a rotation retaining portion configured to retain the substrate in a horizontal state and to rotate the substrate while retaining the substrate in the horizontal state;

an ultrasonic cleaning tool including an ultrasonic wave transmitting tube, the ultrasonic wave transmitting tube possessing a distal end arranged such that ultrasonic wave propagating water, which is cleaning liquid applied with an ultrasonic wave, is sprayed from the ultrasonic cleaning tool toward a contact point on the edge face while the substrate is being rotated by the rotation retaining portion;

the ultrasonic wave transmitting tube ejecting the ultrasonic wave propagating water from the distal end of the ultrasonic wave transmitting tube so that the ultrasonic wave propagating water is ejected from the distal end of the ultrasonic wave transmitting tube only within a range confined between a first line and a second line;

the first line, in plan view, being tangential to the pattern area at a first point and being tangential to the edge face at the contact point;

the second line, in plan view, being tangential to the pattern area at a second point spaced from the first point and being tangential to the edge face at the contact point; and the first line and the second line intersecting only at the contact point.

* * * * *